United States Patent
Alhayek et al.

(10) Patent No.: US 7,521,793 B2
(45) Date of Patent: Apr. 21, 2009

(54) INTEGRATED CIRCUIT MOUNTING FOR THERMAL STRESS RELIEF USEABLE IN A MULTI-CHIP MODULE

(75) Inventors: Iyad Alhayek, Schaumburg, IL (US); Gerry Bianco, Elgin, IL (US); Juergen Broszeit, Neubiberg (DE); Gregory R. Gayowsky, Barrington, IL (US); Ilko Schmadlak, Feldkirchen (DE); George Sotiropoulos, Des Plaines, IL (US)

(73) Assignee: Temic Automotive of North America, Inc., Deer Park, IL (US)

( * ) Notice: Subject to any disclaimer, the term of this patent is extended or adjusted under 35 U.S.C. 154(b) by 224 days.

(21) Appl. No.: 11/234,937

(22) Filed: Sep. 26, 2005

(65) Prior Publication Data

US 2007/0090522 A1 Apr. 26, 2007

(51) Int. Cl.
 *H01L 23/34* (2006.01)
(52) U.S. Cl. ...................... 257/712; 257/774
(58) Field of Classification Search ................ 257/712, 257/778, 734, 774, 723
 See application file for complete search history.

(56) References Cited

U.S. PATENT DOCUMENTS

| | | | | |
|---|---|---|---|---|
| 5,285,352 | A * | 2/1994 | Pastore et al. ............... | 361/707 |
| 5,583,377 | A * | 12/1996 | Higgins, III ................ | 257/707 |
| 5,644,327 | A * | 7/1997 | Onyskevych et al. .......... | 345/80 |
| 5,920,117 | A * | 7/1999 | Sono et al. .................. | 257/675 |
| 5,939,214 | A * | 8/1999 | Mahulikar et al. .......... | 428/626 |
| 6,002,169 | A * | 12/1999 | Chia et al. .................. | 257/697 |
| 6,008,536 | A | 12/1999 | Mertol | |
| 6,455,930 | B1 | 9/2002 | Palanisamy | |
| 6,483,705 | B2 | 11/2002 | Snyder | |
| 6,583,513 | B1 | 6/2003 | Utagikar et al. | |
| 6,635,958 | B2 * | 10/2003 | Bates et al. .................. | 257/703 |
| 2002/0050378 | A1 | 5/2002 | Chiang et al. | |
| 2004/0075166 | A1 | 4/2004 | Yang et al. | |
| 2004/0124512 | A1 * | 7/2004 | Tao et al. ..................... | 257/678 |
| 2005/0146021 | A1 | 7/2005 | Edwards | |

FOREIGN PATENT DOCUMENTS

WO WO01/43167 6/2001

OTHER PUBLICATIONS

The International Search Report and Written Opinion of the International Searching Authority for International Application No. PCT/US06/25668, dated Jan. 16, 2007.

* cited by examiner

*Primary Examiner*—Roy K Potter

(57) ABSTRACT

Disclosed is a mounting structure for mounting an IC on a substrate, and particularly useful in a Multi-Chip Module (MCM). The mounting structure intervenes between the IC and the MCM substrate, and promotes heat dissipation from the IC. The mounting structure is insulative, and preferably comprises a direct bond to copper (DBC) board. A heat spreading region to which the IC is affixed is formed on a surface of the mounting structure with bond pad areas are around the heat spreading region. The other side of the mounting structure is mounted to the substrate, which also has bond pads. Bond pads on the IC are connected to the bond pad areas on the mounting structure, and the bond pad areas on the mounting structure are further coupled to the bond pads on the substrate. Each of these connections is preferably made by wirebonding. Thermal vias can be used in the mounting structure and/or in the substrate to further promote heat dissipation.

20 Claims, 3 Drawing Sheets

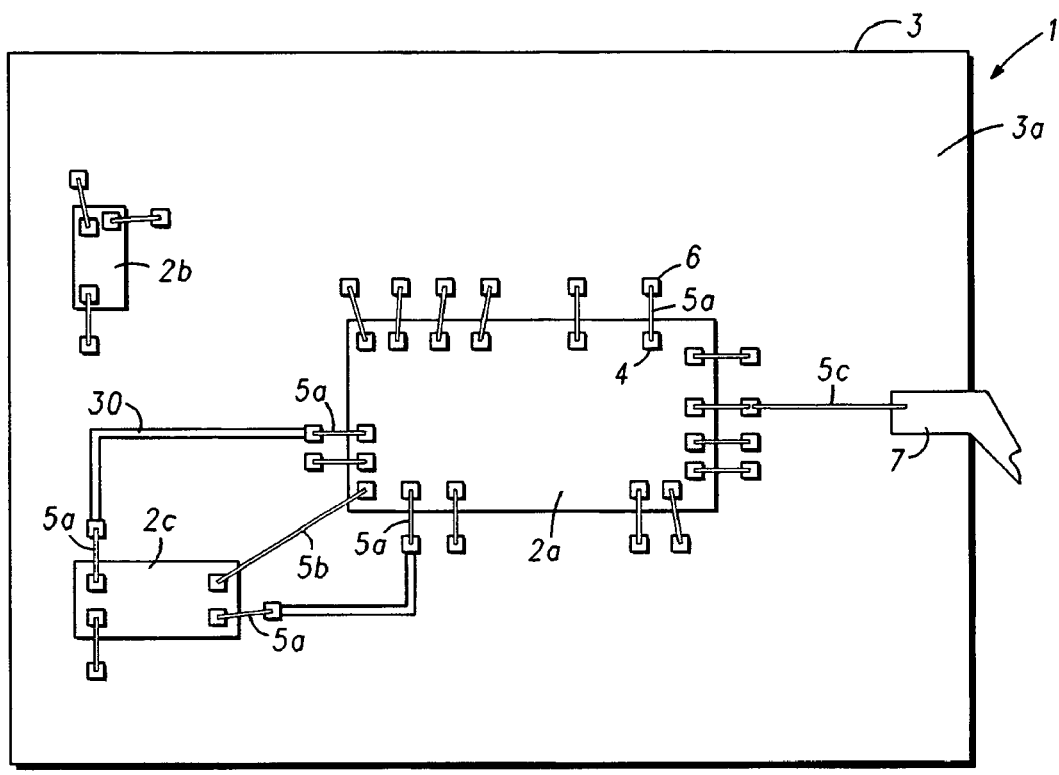
FIG. 1 -PRIOR ART-
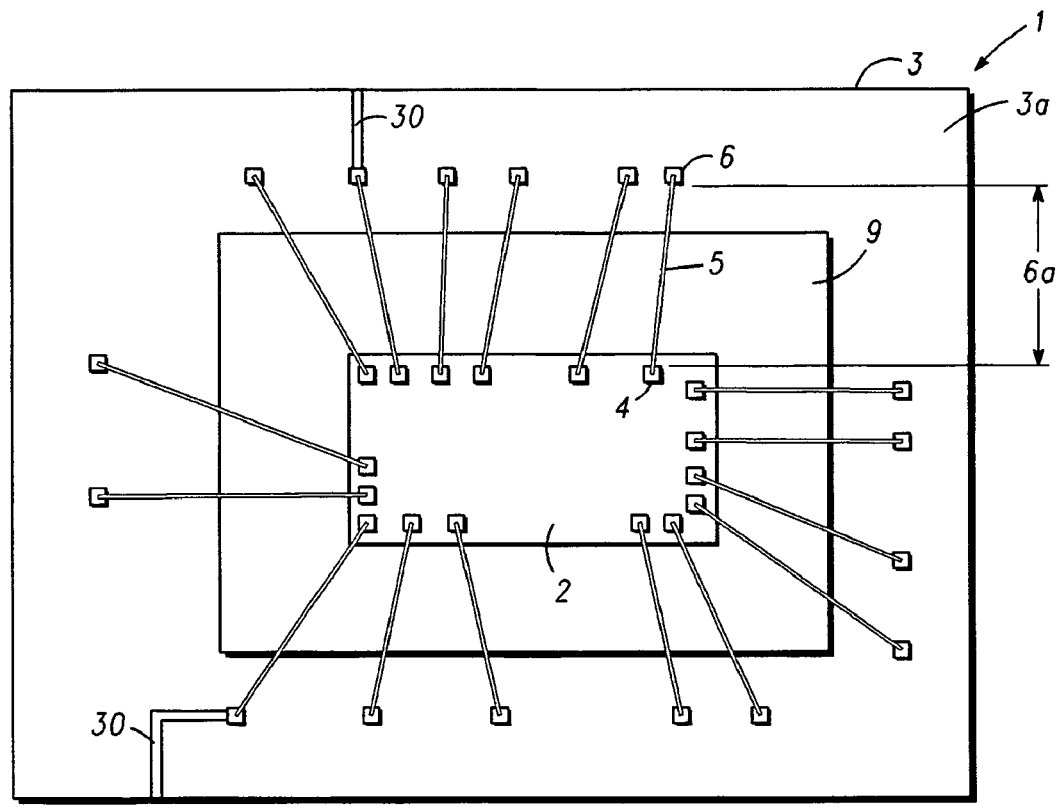
FIG. 2 -PRIOR ART-

INTEGRATED CIRCUIT MOUNTING FOR THERMAL STRESS RELIEF USEABLE IN A MULTI-CHIP MODULE

BACKGROUND OF THE INVENTION

1. Field of the Invention

The present invention relates to techniques for mounting an integrated circuit chip to a substrate in a multi-chip module (MCM), and more specifically to a structure having a heat spreader with intermediate bonding pads for connecting the chip to the MCM.

2. Description of the Related Art

Technical evolution in the field of electronics has resulted in a demand for faster and more compact systems. More advanced applications also necessitate greater numbers of components, which need to communicate with each other. For new systems to meet the requirement of quick access between different components, the length of the paths between different components of the system must be kept within certain limits. However, when the complexity of a system grows, the length of the paths between components also grows. In order not to exceed the maximum allowed distance between such components, these components have been built smaller and have been packed more densely.

Such constraints have given rise to the MCM. An MCM, as is known, comprises a package containing a plurality of interconnected integrated circuits ("ICs," "dies," or "chips"). The package of the MCM supports a lead frame having internally to the package a plurality of connector points (lead fingers) for coupling to the ICs, and having externally to the package a plurality of pins coupleable to a printed circuit board for example.

Internal to the MCM, the ICs are supported by a substrate. Typically, the substrate is insulative but contains conductive electrical traces to allow signals to be routed along the substrate between two or more of the ICs. Ultimately, the ICs in the MCM are electrically coupled by connecting the bond pads of the ICs to the traces, or by directly connecting the bond pads of the ICs together. In either case, such connection usually occurs through the use of bond wires, although "flip chip" technologies may also be used in which the ICs are overturned in the MCM package to bring IC bond pad bumps into contact with traces on the substrate. In any event, once the ICs are interconnected, and once connected to the lead frame of the package, the circuitry and the various connections (e.g., bond wires) are protected by filling the package with a potting material, and/or securing a lid to the package.

FIG. 1 illustrates a top-down view of the inside cavity of a package of a MCM 1. As shown, multiple ICs 2(*a-c*) are mounted to a surface 3*a* of substrate 3. Various substrates useable in MCMs are known in the art, such as low-temperature co-fired ceramics (LTCCs) which are made of one or more layers of ceramic material and are typically bonded to a metal material for support (not shown). As shown, each IC 2 includes bond pads 4 that allow the ICs to be electronically connected to other components of the MCM. The surface 3*a* of the substrate 3 also contains bond pads 6 which connect to traces 30 used to route the signals inside the MCM 1, only a few of which are shown for clarity. As noted above, bond wires 5 are one way of making the necessary connections, and such connections can either connect the IC bond pads 4 to the bond pads 6 of the traces 30 (5*a*), or directly connect two IC bond pads 4 without the need to use an intervening trace 30 (5*b*). Bond wires 5*c* can also be used to ultimately connect either a trace bond pad 6 or an IC bond pad 4 to the lead frame 7 inside the package, which as noted emerges outside the package as a pin.

ICs 2 generate heat when they operate, and this can cause particular problems in an MCM 1 because many ICs are packed densely together. As is known, excessive heat can compromise the operation of an IC, and in turn can compromise the performance of the MCM 1. One method of combating heat generation has been to provide a heat spreader 9 between an IC 2*a* that generates excessive heat and the substrate surface 3*a*, as shown in FIG. 2. Heat spreader 9 is a layer of a thermally conductive material, for example a metal such as copper. Heat spreader 9 spreads the heat generated by IC 2*a* over an extended area, thus facilitating heat dissipation and also mitigating problems which might be caused by isolated "hot-spots" on the IC 2, which can cause the IC to malfunction.

While addressing the problem of heat accumulation, however, the implementation of heat spreader 9 compromises the dependability of MCM 1 because the distance 6*a* between IC bond pads 4 and the trace bond pads 6 is substantially increased due to the spatial extent of the heat spreader 9. As a result, bond wires 5 connecting these two types of bond pads are also lengthened, which makes the MCM 1 prone to failure. Bond wires 5 that are appreciably long are also relatively heavy, and are thus prone to breaking, particularly when subject to mechanical vibrations. Also, the length and weight of the bond wires spanning over the heat spreader can cause such bond wires to "droop," which puts them at risk for touching the conductive heat spreader 9 and shorting thereto. Thus, simply introducing a heat spreader 9 may not be a viable solution to the problem of heat accumulation in MCM 1, and improved solutions are needed. Moreover, while the spatial extent of the heat spreader 9 could be made smaller, this also reduces its heat dissipation properties, and hence does not provide a viable solution.

Size, temperature, complexity, or cost constraints generally hamper prior heat dissipation techniques utilized in MCMs. See, e.g., U.S. Pat. Nos. 6,455,930, 6,483,705, and International Patent Publication No. WO 01/43167, which are all incorporated herein by reference. It is therefore desirable to provide alternative techniques for mounting ICs on substrates in MCMs in a way that effectively dissipates the heat generated by the IC but is cost efficient, simple, easy to manufacture, and not prone to failure.

BRIEF DESCRIPTION OF THE DRAWINGS

FIG. 1 illustrates a prior art MCM having three ICs mounted on a substrate.

FIG. 2 illustrates a prior art MCM wherein an IC is mounted on a thermally conducting heat-spreading layer disposed on a substrate.

DETAILED DESCRIPTION

In an embodiment of the present invention, a mounting structure for mounting an IC on a substrate, which is particularly useful in the context of a MCM, is disclosed. The mounting structure intervenes between the IC and the MCM substrate, and promotes heat dissipation from the IC. The mounting structure, however, is isolative, and in one embodiment comprises a direct bond to copper (DBC) board. On one of the conductive sides of the DBC board, a heat spreading region is formed in the center with bond pad areas around the heat spreading region at the periphery of the DBC. The IC is mounted to the heat spreading region to assist is heat dissipation from the IC. The other side of the mounting structure is mounted to the substrate, which also has bond pads. In an embodiment of the present invention, bond pads on the IC are connected to the bond pad areas on the mounting structure, and the bond pad areas on the mounting structure are further coupled to the bond pads on the substrate. In an embodiment of the present invention, each of these connections is made by wire-bonding, although flip chip techniques can also be used to couple the IC bond pads to the mounting structure bond pads. Thermal vias can be used in the mounting structure and/or in the substrate to further promote heat dissipation. Through use of the disclosed technique, the ICs heat can be dissipated while the IC can also be electrically coupled to the substrate without the use of long bond wires.

Thus, the present invention provides a structure for mounting an IC on a substrate in a MCM, wherein the structure facilitates heat dissipation but does not introduce the vulnerabilities associated with the heat spreader configuration illustrated in FIG. 2.

Figure 3:
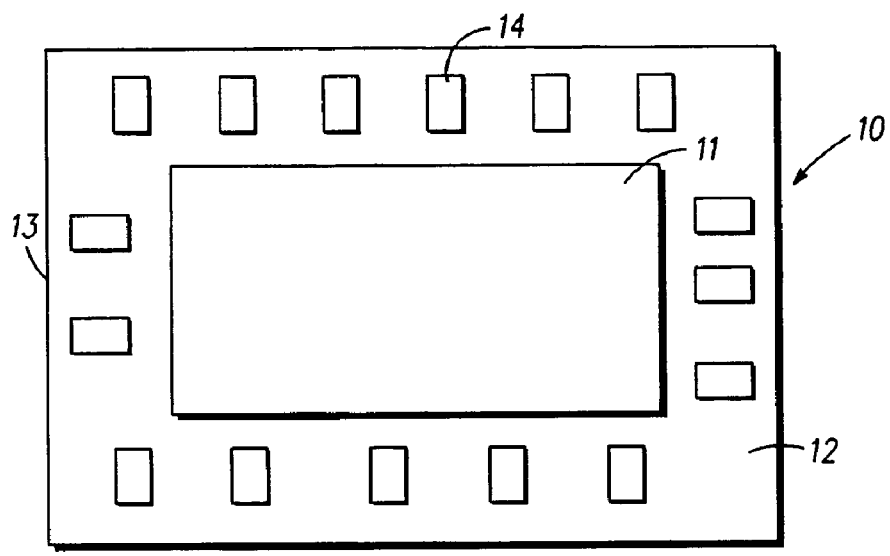
FIG. 3 illustrates a structure for mounting an IC to a substrate, wherein the structure includes a thermally conducting heat-spreading layer and intermediate bond pads.

Referring now to FIG. 3, the structure 10 of the present invention includes a thermally conductive heat spreading layer 11 disposed on a surface 12 of a board 13. Heat spreading layer 11 is made from a thermally conductive material such as a metal, for example copper. Board 13 can be any material that provides a suitable surface for supporting heat spreading layer 11 and an IC (not shown in FIG. 3). An example of a material for board 13 is a direct bond to copper (DBC) board. DBC is known in the art and is typically made of a layer of ceramic such as aluminum oxide or aluminum nitride sandwiched between two metal layers such a copper foil. Mounting structure 10 also includes intermediate bond pads 14, which, as will be described below, allow the use of shorter bond wires for connecting an IC mounted on the structure 10 to other devices on the MCM substrate. When board 13 is made from a material such as DBC, copper can be etched from one surface of the DBC to provide heat spreading layer 11 and intermediate bond pads 14.

Figure 4:
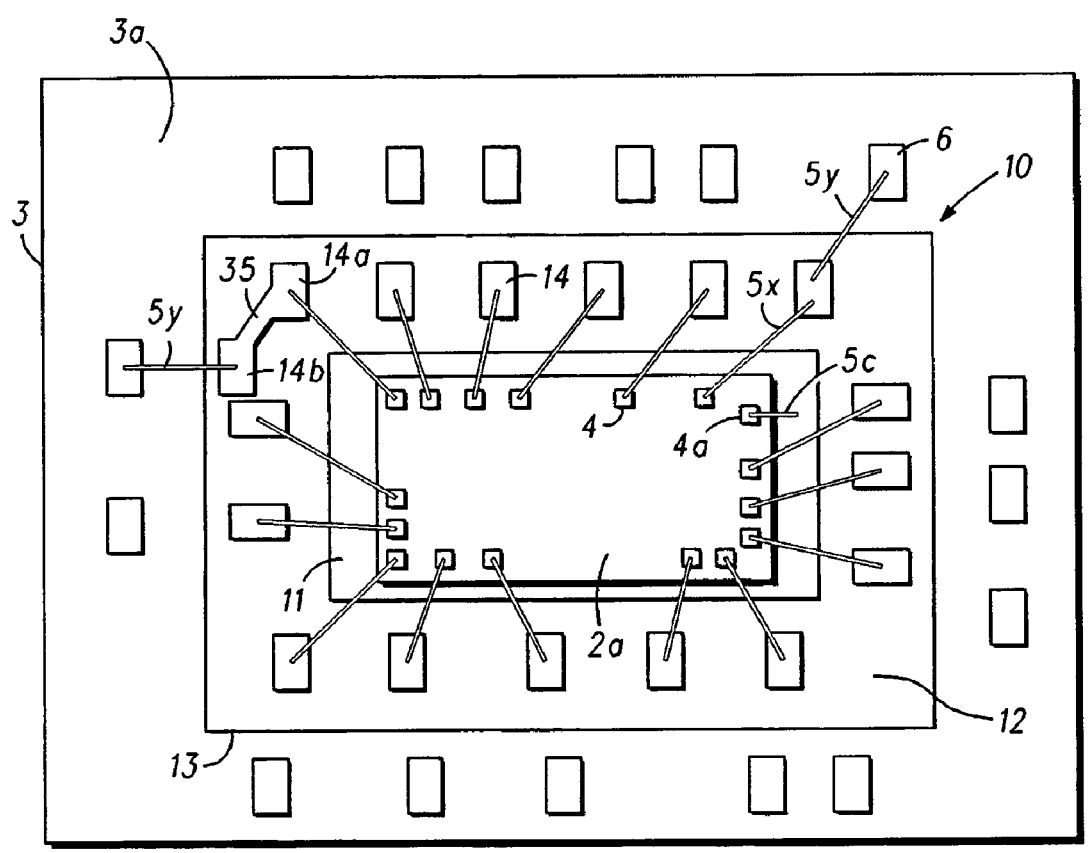
FIG. 4 illustrates a multi-chip module having an IC mounted on a substrate using a mounting structure as illustrated in FIG. 3.

FIG. 4 illustrates an IC 2a as mounted on structure 10, which is in turn mounted on surface 3a of substrate 3 of an MCM. Specifically, IC 2a is mounted on the conductive heat spreading layer 11, and as such structure 10 as facilitated by layer 11 acts as a heat spreader. Bond pads 4 on the IC are wirebonded via bond wires 5x to intermediate bond pads 14, which are in turn wirebonded via bond wires 5y to bond pads 6 on substrate 3. Thus, structure 10 overcomes the drawbacks discussed above associated with long distance bond wires when using a heat spreader by providing an intermediate contact point (e.g., intermediate bond pad 14) on the structure 10 to break the distance in two. Because the bond wires 5x and 5y are now shorter in length, they are less prone to breaking and drooping, resulting in a more reliable MCM device.

Although shown primarily as a single area, intermediate bond pads 14 can in effect be lengthened to form an intermediate trace 35 between two different intermediate bond pads 14a, 14b which are respectively connected via bond wires 5x and 5y to IC bond pads 4 and substrate bond pads 6, as shown by example in the upper left corner of the structure 10 in FIG. 4. The use of intermediate traces 35 provides additional routing flexibility, as well as promoting heat spreading while providing for shorter bond wires. Recognizing the functional similarity between a signal intermediate bond pad 14 and two bond pads (14a, 14B; nodes) coupled by a trace, both configurations can be generally referred to as contact points or contacts.

In some applications it may be desirable to wirebond one or more bond pads 4a on the IC directly to heat spreading layer 11, as illustrated by bond wire 5c. For example, ground bond pad 4a can be shorted to the heat spreading layer, and hence to the substrate of IC 2a, in this manner.

FIG. 4 illustrates an embodiment wherein bond pads 4 on IC 2a electrically contact intermediate bond pads 14 via bond wires 5x. One of skill in the art will appreciate that other configurations can provide the same result. For example, IC 2a could be implemented in a flip-chip configuration such that bond pads 4 contact intermediate bond pads 14 directly via a bond pad bump, and without the use of bond wires 5x.

Figure 5:
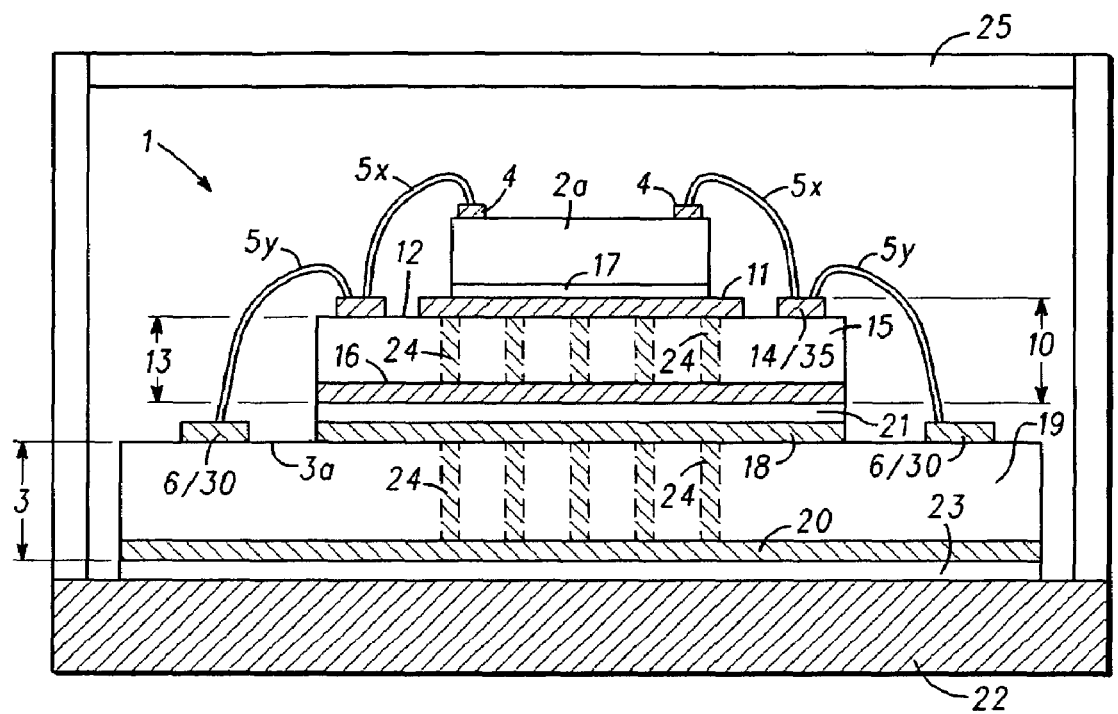
FIG. 5 illustrates a cross-section view of an IC mounted on a substrate using a mounting structure depicted in FIG. 3.

FIG. 5 illustrates a cross section of an IC 2a mounted on a MCM substrate 3 using a structure 10 as disclosed herein. Structure 10, as noted above, includes board 13, which may be made of one or more layers of ceramic material 15 disposed on a conducting material 16. According to one embodiment, board 13 is a DBC board, and ceramic layer 15 ranges between approximately 0.01 to approximately 0.03 inches thick. Examples of suitable ceramic materials include, but is not limited to, aluminum oxide, aluminum nitride, silicon carbide, beryllium oxide, or the like. If board 13 is DBC, then conducting material 16 is typically copper. According to one embodiment, the conducting material 16 ranges between approximately 0.001 inches to approximately 0.025 inches thick. Intermediate bond pads 14 and heat spreading layer 11 are disposed on surface 12 of structure 10. According to one embodiment of the present invention, intermediate bond pads 14 and heat spreading layer 11 range between approximately 0.001 inches to approximately 0.025 inches thick. As described above, when board 13 is made of DBC, heat spreading layer 11 and intermediate bond pads 14 are formed from the same layer and can be etched from one of the copper layers of the DBC.

Still referring to FIG. 5, IC 2a is bonded to heat spreading layer 11 by any technique known in the art for bonding an IC to a conductive layer board. For example, IC 2a can be bonded to heat spreading layer 11 with a bonding layer 17 of solder or electrically conductive adhesive. Examples of electrically conductive adhesive include, but is not limited to, Emerson and Cumming CE3104 electrically conductive adhesive, available from Emerson and Cumming (Billerica, Mass.). According to one embodiment, bonding layer 17 ranges between approximately 0.001 inches to approximately 0.007 inches thick. As noted earlier, bond pads 4 on IC 2a are wirebonded to intermediate bond pads 14/intermediate traces 35 on surface 12 of structure 10 via bond wires 5x, while intermediate bond pads 14/intermediate traces 35 are in turn wirebonded to bond pads 6 on substrate 3 via bond wires 5y.

Structure 10 is adhered to a conductive mounting region 18 on the surface 3a of substrate 3, for example, by an adhesive 21, such as Emerson and Cumming CE3104 electrically conductive adhesive, available from Emerson and Cumming (Billerica, Mass.). Solder could also be used for attachment. The mounting region 18 may comprise the same bond pad 6/trace 30 layer discussed earlier. Substrate 3 can be any substrate known in the art for supporting electronic devices, and as mentioned earlier can comprise a LTCC, which includes a layer of ceramic 19 that is disposed on a layer conducting material 20, for example a metal such as copper. Examples of other suitable materials include silicon carbide, high temperature co-fired ceramic (HTCC), FR4 or other organic boards, ALN, insulated metal substrates or polyamide board. Substrate 3 can be adhered via a layer of thermally conductive adhesive 23 to a base plate 22 that may be a metal such as aluminum.

Still referring to FIG. 5, thermal vias 24 can optionally be included in board 13 and/or LTCC layer 19 to further facilitate heat dissipation, e.g., from the IC 2a to the metal base plate 22. Thermal vias 24 can be for example columns of a thermally conducting material, for example a metal such as copper, gold or silver. According to one embodiment, thermal vias 24 are approximately 0.004 inches in diameter or greater. Additionally, it may be desirable for some applications that thermal vias 24 also provide an electrically conductive path, which would then allow a mechanism to ground the IC 2a's substrate to the base plate 22, etc.

Still referring to FIG. 5, MCM 1 is contained in a housing 25, which is typical and can be formed on many different types of materials. As noted, the cavity within the housing containing the IC 2a, the structure 10, the substrate 3, etc., can be filled with a potting compound to protect the bond wires, and/or a lid can be secured to the top of the package. It should also be understood that the package will contain a lead frame or connector to which various circuit nodes can be bonded, although not shown.

It should be understood that while the present disclosure discloses a structure for mounting an IC on a substrate in a MCM, the structure is not limited for use in a MCM. The structure can be used in any application in which an IC must be mounted on a substrate of any kind.

It should be understood that the inventive concepts disclosed herein are capable of many modifications. To the extent such modifications fall within the scope of the appended claims and their equivalents, they are intended to be covered by this patent.

We claim:

1. A system for mounting an integrated circuit, comprising:
   a substrate having a surface and having a plurality of substrate contacts disposed on the surface;
   a mounting structure mounted to the substrate, the mounting structure comprising an electrically insulating surface on which are disposed a plurality of mounting structure contacts and a heat spreading region, wherein at least one of the mounting structure contacts is electrically connected to one of the substrate contacts; and
   an integrated circuit mounted on the heat spreading region of mounting structure, the integrated circuit comprising a plurality of integrated circuit bond pads, wherein at least one of the integrated circuit bond pads is electrically connected to the at least one of the mounting structure contacts.

2. The system of claim 1, wherein the substrate comprises low temperature co-fired ceramic (LTCC).

3. The system of claim 1, wherein at least one of the integrated circuit bond pads is electrically connected to one of the mounting structure contacts by at least one of a bond wire or an integrated circuit bond pad bump.

4. The system of claim 3, wherein the integrated circuit is mounted to the mounting structure in a flip chip arrangement.

5. The system of claim 1, wherein the mounting structure further comprises one or more thermal vias extending through the mounting structure proximate to the heat spreading region.

6. The system of claim 1, wherein the substrate further comprises one or more thermal vias extending through the substrate proximate to the mounting structure.

7. The system of claim 1, wherein at least one of the mounting structure contacts is electrically connected to one of the substrate contacts by bond wires.

8. The system of claim 1, wherein at least one of the integrated circuit bond pads is electrically connected to one of the mounting structure contacts by a bond wire, and wherein at least one of the mounting structure contacts is electrically connected to one of the substrate contacts by a bond wire.

9. The system of claim 1, wherein the contacts are bond pads.

10. The system of claim 1, wherein the contacts comprise nodes coupled together by a trace.

11. A multi-chip module, comprising:
    a substrate having a surface and having a plurality of substrate contacts disposed on the surface;
    a first integrated circuit adhered to the substrate surface, the first integrated circuit comprising a plurality of first integrated circuit bond pads, wherein at least one of the first integrated circuit bond pads is electrically connected to one of the substrate contacts;
    a mounting structure mounted to the substrate, the mounting structure comprising an electrically insulating surface on which are disposed a plurality of mounting structure contacts and a heat spreading region, wherein at least one of the mounting structure contacts is electrically connected to one of the substrate contacts; and
    a second integrated circuit mounted on the heat spreading region of mounting structure, the second integrated circuit comprising a plurality of second integrated circuit bond pads, wherein at least one of the second integrated circuit bond pads is electrically connected to the at least one of the mounting structure contacts.

12. The multi-chip module of claim 11, wherein the substrate comprises low temperature co-fired ceramic (LTCC).

13. The multi-chip module of claim 11, wherein at least one of the second integrated circuit bond pads is electrically connected to one of the mounting structure contacts by at least one of a bond wire or an integrated circuit bond pad bump.

14. The multi-chip module of claim 13, wherein the second integrated circuit is mounted to the mounting structure in a flip chip arrangement.

15. The multi-chip module of claim 11, wherein the mounting structure further comprises one or more thermal vias extending through the mounting structure proximate to the heat spreading region.

16. The multi-chip module of claim 11, wherein the substrate further comprises one or more thermal vias extending through the substrate proximate to the mounting structure.

17. The multi-chip module of claim 11, wherein at least one of the mounting structure contacts is electrically connected to one of the substrate contacts by bond wires.

18. The multi-chip module of claim 11, wherein at least one of the second integrated circuit bond pads is electrically connected to one of the mounting structure contacts by a bond wire, and wherein at least one of the mounting structure contacts is electrically connected to one of the substrate contacts by a bond wire.

19. The multi-chip module of claim 11, wherein the contacts are bond pads.

20. The multi-chip module of claim 11, wherein the contacts comprise nodes coupled together by a trace.

* * * * *